(12) United States Patent
Amann et al.

(10) Patent No.: US 9,280,620 B2
(45) Date of Patent: Mar. 8, 2016

(54) METHOD AND SYSTEM FOR PROBABILISTIC FATIGUE CRACK LIFE ESTIMATION

(71) Applicants: Christian Amann, Bottrop (DE); Phillip W. Gravett, Orlando, FL (US); Kai Kadau, Clover, SC (US)

(72) Inventors: Christian Amann, Bottrop (DE); Phillip W. Gravett, Orlando, FL (US); Kai Kadau, Clover, SC (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 658 days.

(21) Appl. No.: 13/652,671

(22) Filed: Oct. 16, 2012

(65) Prior Publication Data

US 2014/0107948 A1    Apr. 17, 2014

(51) Int. Cl.
| | |
|---|---|
| *G01F 17/00* | (2006.01) |
| *G01B 5/00* | (2006.01) |
| *G06F 17/50* | (2006.01) |
| *G01B 5/30* | (2006.01) |
| G01B 5/04 | (2006.01) |
| H01L 21/66 | (2006.01) |
| H01L 21/67 | (2006.01) |

(52) U.S. Cl.
CPC .............. *G06F 17/5018* (2013.01); *G01B 5/30* (2013.01); *G01B 5/00* (2013.01); *G01B 5/04* (2013.01); *H01L 21/67* (2013.01); *H01L 21/67276* (2013.01); *H01L 21/67288* (2013.01); *H01L 22/12* (2013.01)

(58) Field of Classification Search
CPC .............. G01B 5/24; G01B 5/30; G01B 5/00; G01B 5/04; C21D 2241/00; H01L 22/12; H01L 21/67; H01L 21/67276; H01L 21/67288
USPC ........................................................ 702/35
See application file for complete search history.

(56) References Cited

U.S. PATENT DOCUMENTS

| | | | | |
|---|---|---|---|---|
| 4,265,120 A | * | 5/1981 | Morris .................... | G01N 29/11 73/600 |
| 7,219,044 B1 | * | 5/2007 | Prevey .................... | G06F 17/50 703/7 |
| 7,451,657 B2 | * | 11/2008 | Goldfine et al. ................ | 73/760 |

(Continued)

OTHER PUBLICATIONS

Zoran Perović, Computer Simulation of Cumulative Fatigue Damage, 2002.*

(Continued)

*Primary Examiner* — John Breene
*Assistant Examiner* — Lynda Dinh

(57) ABSTRACT

A probabilistic estimation of fatigue crack life of a component is provided. A plurality of representations of the component is defined from material property scatter data and flaw-size scatter data, wherein each representation is defined by one possible material condition and flaw-size condition associated with the component. For each representation, a component location is selected and a determination is made whether said individual representation fails after a given number of cycles N, based on the calculation of a crack growth in the selected location. The crack growth is calculated on the basis of the material condition and the flaw-size condition in the selected location. Failure of the individual representation is determined if the crack growth is determined to be unstable. The sum total of the number of the representations that failed after N cycles is determined. A probability of failure of the component after N cycles is then determined.

14 Claims, 13 Drawing Sheets

(56) References Cited

U.S. PATENT DOCUMENTS

| | | | | |
|---|---|---|---|---|
| 2007/0068605 | A1* | 3/2007 | Statnikov | C21D 10/00 148/558 |
| 2007/0239407 | A1* | 10/2007 | Goldfine | G06N 7/00 703/2 |
| 2011/0054806 | A1* | 3/2011 | Goldfine et al. | 702/34 |
| 2012/0152007 | A1* | 6/2012 | Holmes | G01M 15/14 73/112.01 |

OTHER PUBLICATIONS

Leskovec et al., Scalable Modeling of Real Graphs using Kronecker Multiplication, 2007.*

Polak et al., Mechanisms of the early fatigue danage in Metallic materials and included other articles, 2006. http://www.uniza.sk/komunikacie/archiv/2006/4/4_2006en.pdf.*

Kantzos P. et al; "Effect of Powder Cleanliness on the Fatigue Behavior of Powder Metallurgy Ni-Disk Alloy UDIMET 720"; Superalloys 2004 (Tenth Inernational Symposium); pp. 409-417; ISBN: 978-0-87-339576-2; DOI: 10.7449/2004/Superalloys_2004_409_417; XP055091166; Jan. 1, 2004.

Craig McClung et al; "Integration of NASA-Deceloped Lifting Technology for PM Alloys into DARWIN"; NASA/CR-2011-216977; URL: http://ntrs.nasa.gov/archive/nasa/casi.ntrs.nasa.gov/20110008275_2011009094.pdf; XP055091215; Jan. 1, 2011.

J-M Bourinet and M. Lemaire, "Form Sensitivities to Correlation: Application to Fatigue Crack Propagation Based on Virkler Data", Proc. 4th Int. ASRANet Colloquium, Athens, 2008.

Zdenek P. Bazant, "Probabilistic modeling of quasibrittle fracture and size effect", Structural Safety and Reliability, Corotis et al. (eds), © 2001 Swets & Zeitinger, ISBN 90 5809 197 X, pp. 1-23.

* cited by examiner

METHOD AND SYSTEM FOR PROBABILISTIC FATIGUE CRACK LIFE ESTIMATION

FIELD OF INVENTION

The present invention relates to a method and a system for probabilistic estimation of fatigue crack life of a component being subjected cyclic stress.

BACKGROUND OF INVENTION

In a plurality of applications in technical systems, parts or components can be subject to stresses, both mechanical and thermal, which alternate or vary over time. In such cases individual parts can for example be subject to direct mechanical stresses through the occurrence of compressive or tensile forces. A time-varying thermal stress of this type arises on the other hand for example for the parts or components in a turbine system, especially in a gas turbine, when the gas turbine is started up or shut down.

Extreme cyclic loading, both mechanical and thermal, results in material fatigue, which, in many cases limits the life of the component. In general, fatigue crack growth (FCG) under cyclic loading is oftentimes the life limiting mechanism of a component. Small cracks typically nucleate from inherent flaws, such as preexisting flaws in a forging, or initiate by other crack initiation mechanisms such as Low Cycle Fatigue (LCF) when a component is in service. During each cycle, typically a start and shutdown of an engine or another change of operating condition, small cracks grow incrementally without impacting the structural integrity of the component. This is referred to as stable crack growth. When the crack sizes reaches a critical size, the crack growth becomes unstable and the component fails. The cycle N at which this happens is called the fatigue crack life of the component. The crack growth can be estimated by Linear Elastic Fracture Mechanics (LEFM) in conjunction with the appropriate transient stress field of the component estimated by Finite Element Analyses (FEA).

In LEFM, the material properties that are of utmost importance for estimating the fracture mechanics life are the fracture toughness ($K_{1c}(T)$) and the crack growth rate ($da/dN(\Delta K, T, R)$), where da=crack size increment, dN=cycle increment, $\Delta K$=stress intensity factor difference characterizing the stress cycle, T=Temperature, R=R-ratio[stress minimum/stress maximum]. Extensions of LEFM that take into account non-linear effects, additionally require tensile properties, such as yield strength (RP02), ultimate yield strength (RM), and Young's modulus (E). Known examples of theses extensions are Failure Assessment Diagram (FAD) and Irwin Plastic Zone Extension (IPZE).

Furthermore, initial flaw sizes need to be known in order to perform a LEFM calculation. Once these parameters are known, the fatigue crack life N can be calculated by approximating the crack by a plate solution of, for example, an elliptical embedded or semi-elliptical surface crack.

Measurements show that all of those material properties and initial flaw sizes have inherent scatter due to the complexity of manufacturing parts. Furthermore, aging of material properties depend strongly on the individual component operation, initial material microstructure, and chemical composition and therefore lead to a different scatter in the material properties of the aged component.

Due to the uncertainties in material properties and initial flaw sizes, the estimation of fracture mechanics life is complicated. Therefore, for many components fatigue crack growth is not even designed for, or extremely conservative assumptions are made. This can lead to a very conservative design which does not use all the potential of a component.

Two state of the art approaches of fatigue crack life calculation will now be described.

The first approach involves deterministic fracture mechanics life calculation based on minimum/maximum material properties and flaw-sizes. This approach falls under the so-called safe-life design philosophy and is primarily used for land-based heavy duty gas and steam turbines. In this approach, conservative estimates of material properties and initial flaw sizes are used. For example, the fracture toughness ($K_{1c}$) is estimated by a minimum curve with most of the measured data having larger $K_{1c}$ values. For the crack growth rate (da/dN) a maximum curve is estimated with most of the measured data having smaller values. The flaw-size is typically estimated by the resolution of the non-destructive examination (NDE) technique that is performed before the component is used in an engine or during a life time extension (LTE).

With the above-described 'worst case' assumptions, the fatigue crack life N can be conservatively estimated by LEFM, or the aforementioned extensions such as FAD and IPZE analysis for one location of the component. The location provides the stress/temperature input for the LEFM analysis. This location, or sometimes multiple locations, is chosen in such as way that it is the life limiting location, i.e. having the largest stress values and amplitude. The cycle number N at which the crack growth becomes unstable is then assumed to be the fatigue crack life of the component. Sometimes yet another safety factor is applied either on N or elsewhere.

The drawback of such a deterministic fracture mechanics calculation is that the quality of a component is solely based upon a single or only a few locations of the component and minimum/maximum material properties. The information about material data and flaw size scatter is not used at all. Furthermore, due to the scatter of input parameters there will still be a very low probability of failure (PoF) that the component has for the calculated number of cycles N. The PoF is not determined by the deterministic method as it uses only minimum/maximum property/flaw size estimations.

The second approach involves probabilistic fracture mechanics calculation based on flaw-size distribution and distributions of inspection intervals. This particularly used in the aero engine industry. To this end, a tool DARWIN™ (Design Assessment of Reliability with Inspection) has been developed that calculates the accumulated probability of failure (PoF) as a function of cycles N. This methodology focuses on the influence of inspection intervals, initial flaw size distribution, and the mixing of different missions such as start, climbing, cruise at different altitude, in-flight changes in altitude, go-arounds etc. This approach does not account for material property variations. The user can however add a width of the life distribution <N>. This width of the life distribution can be estimated by a series of complex testing that compounds all individual material scatter under different loading conditions or the width is deemed not to be important and set to 0. The user then has to define a limited number of spatial zones within the Finite Element Model (FEM). In each of those zones a crack is defined and a limited number of LEFM fatigue crack growth calculation are performed that represent the possible flaw size distribution. Each zone i is thereby assigned with a probability of failure PoF (N,i), the total PoF (N) is then calculated based on a complex summation of the individual PoF (N,i). The total number of LEFM calculations performed is limited as the problem gets computationally involved and execution times increase. For low PoF this can lead to errors in the estimation of the PoF as details of the failure surface might not be correctly resolved.

The drawback of the second approach is that it does not account for individual material scatter and evaluates the risk for each zone by one representative crack, i.e. the user puts the crack in a location in each zone that he thinks is representative for the whole zone. Therefore, a zone-refinement convergence check has to be performed to see whether the results still depend on the zone size.

SUMMARY OF INVENTION

An object is to provide an improved technique for probabilistic fatigue crack life estimation that obviates at least some of the drawbacks of the above-mentioned state of the art.

The above object is achieved by the features of the independent claims. Further advantageous developments are provided by the dependent claims.

In contrast to the above-mentioned state of the art, the present invention takes into account scatter in both material properties and flaw-size. To that end, the proposed method incorporates all material property distributions, flaw-size distributions and component locations to determine a probability of failure PoF(N), which is the accumulated failure risk for N cycles. In the illustrated embodiments, the failure criteria used is crack instability.

The proposed method defines a large number of samples or component representations. Each sample is a representation of the component which is defined by one possible material condition and flaw-size condition of the component, obtained from material property scatter data and flaw-size scatter data of the component. In one embodiment, the proposed method is realized by a Monte-Carlo methodology. In an exemplary scenario, the number of such representations would be in the range of millions to trillions. It may be assumed that each individual representation has the same probability of occurrence (micro-canonical ensemble). Each condition of representation is configured by drawing values from individual material property distributions (or scatter data). In the illustrated embodiments, the flaw position distribution is assumed to be constant, i.e. each volume element in the component has the same probability of having a defect.

For each individual representation, a component location is selected. A determination is then made whether said individual representation fails after a given number of cycles N, based on determination of a crack growth in the selected location. The crack growth is determined on the basis of the material condition and the flaw-size condition in the selected location. Failure of the individual representation is determined if the crack growth is determined to be unstable. A sum total of the number of the representations that failed after N cycles is determined. From this, a probability of failure of the component after N cycles is determined as PoF(N)=Nf/S, wherein:
PoF(N) is the probability of failure of the component after N cycles,
Nf is the sum total of the number of representations that are determined to have failed after N cycles, and
S is the total number of representations.

In a further embodiment, a failure map is generated after a predetermined number of cycles, the failure map indicating the number of failed representations in an area.

In one embodiment, the crack growth calculation for each of the representations is made on the basis of an LEFM analysis. To that end, the material properties of the component that are considered include at least fracture toughness ($K_{1c}$) and crack growth rate (da/dN).

In a further embodiment, additional material properties such as yield strength (RP02) and/or ultimate yield strength (RM) and/or Young's modulus (E) may be taken into account to define the component condition. In such cases, extensions of LEFM such as FAD or IPZE may be used for crack growth determination.

In one embodiment, a critical transient state map of the component is generated based on the material condition of the component, wherein the critical transient state map represents a stress and temperature distribution of the component where each component location is assigned a critical stress value and a critical temperature value.

In one embodiment, the stress/temperature distribution of the component is described by a FEA and read-in by the code for fracture mechanics analysis (such as LEFM or FAD or IPZE). The code automatically assigns for each location critical stress/temperature values from a transient (cyclic) FEA that enter the subsequent fracture mechanics analysis In one embodiment, each individual representation may have a slightly different stress and temperature distribution accounting for uncertainties in the stress/temperature conditions.

In a further embodiment, slight variations in geometry may be provided in each representation that account for manufacturing tolerances can also be considered.

In one embodiment, the crack growth is computed by a numerical integration of a crack growth rate da/dN, where 'da' designates crack size increment and 'dN' designates cycle increment, wherein the integration is carried out using a modified Runge-Kutta integration scheme that always overestimates the crack-growth irrespective of the integration step size.

The above integration scheme allows for a conservative estimation of the crack growth in one (or a few if desired) integration steps. If, after this conservative estimation of the crack growth for the total number of cycles, the crack is still stable, there is no further need evaluate the crack growth as the component will not fail for that particular representation. The calculation time of these stable cracks can be significantly reduced (typically a factor of 1000).

The flaw size, as measured by NDE techniques is found to be smaller or larger than the actual or True Flaw Size, often by several orders of magnitude.

Accordingly, in one embodiment, the flaw-size condition of a selected location of an individual representation is obtained from a True Flaw Size distribution data, wherein the True Flaw Size distribution data is determined based on:
NDE indicated flaw size distribution data,
a probability of detection 'PoD' of said NDE technique, and
conversion factor distribution data, wherein conversion factor is defined as k=TFS/KSR, where
K designates conversion factor
TFS designates a True Flaw Size, and
KSR designates NDE indicated flaw size.

In a further embodiment, the distribution of the ratio k=TFS/KSR is incorporated into the fracture mechanics analyses via a Monte-Carlo method. According to this embodiment, the True Flaw Size distribution data is determined as:

$$\{TFS\}=PoD_{MC}[\{KSR\} \otimes \{k\}]$$

where
{TFS} designates True Flaw Size distribution data,
{KSR} designates NDE indicated flaw-size distribution data, {k} designates conversion factor distribution data,
⊗ designates a Kronecker multiplication operation, and
$PoD_{MC}$ [data set] is a Monte-Carlo operation that exchanges zero-data or small value data in [data set] with non-zero data that accounts for non-detected flaws as described by the probability of detection of the NDE technique.

In a further embodiment, in order to determine the risk per start, the method further includes determining a hazard function or risk per cycle, as $$H(N+1)=(PoF(N+1)-PoF(N))/(1-PoF(N)),$$

where
H is the hazard function or risk per cycle,
N is the number of cycles,
PoF is the probability of failure.

In another aspect, a method is provided for operating a component under cyclic stress. The method includes scheduling a downtime or maintenance interval of said component taking into account a probabilistic fatigue crack life of the component as estimated by any of the any of the above-described embodiments.

In yet another aspect, a system is provided that comprises suitable means for realizing the method according to any of the embodiments described above.

BRIEF DESCRIPTION OF THE DRAWINGS

The present invention is further described hereinafter with reference to illustrated embodiments shown in the accompanying drawings, in which.

DETAILED DESCRIPTION OF INVENTION

The embodiments illustrated below provide a fatigue crack life estimation of a component based on direct simulation probabilistic fracture mechanics. The proposed method performs a large number of individual fracture mechanics simulations to determine the life-distribution <N> and thus the probability of failure PoF(N) of a component. The illustrated embodiments use a Monte-Carlo Methodology which is defined by a large number of samples or representations S (typically, S is of the order of millions to trillions), each of which represents one possible component condition. Each condition of a representation is defined by drawing values from material distributions and flaw-size distribution. A fracture mechanics analysis (for example, LEFM or its extensions such as IPZE or FAD) is carried out for each of these large number of representations, that determines whether or not each of these representations fails after a given number of cycles N, based on a calculation of crack growth. From this, the PoF(N) is determined by determining the number of representations Nf that failed after N cycles, and dividing the number Nf by the total number of representations S.

The illustrated embodiments are particularly suitable for fatigue crack life estimation of forged rotor components of heavy duty industrial gas and steam turbines and generators. The present invention may also apply to other components of heavy duty industrial turbines such as blades, vanes, transitions, casing components, etc, as well as to diverse components, such as components of smaller industrial gas-turbines, aero-engines, aircraft, wind turbine parts such as blades, pressure vessels and piping, semiconductor electronics such as microchips, etc.

Figure 1:
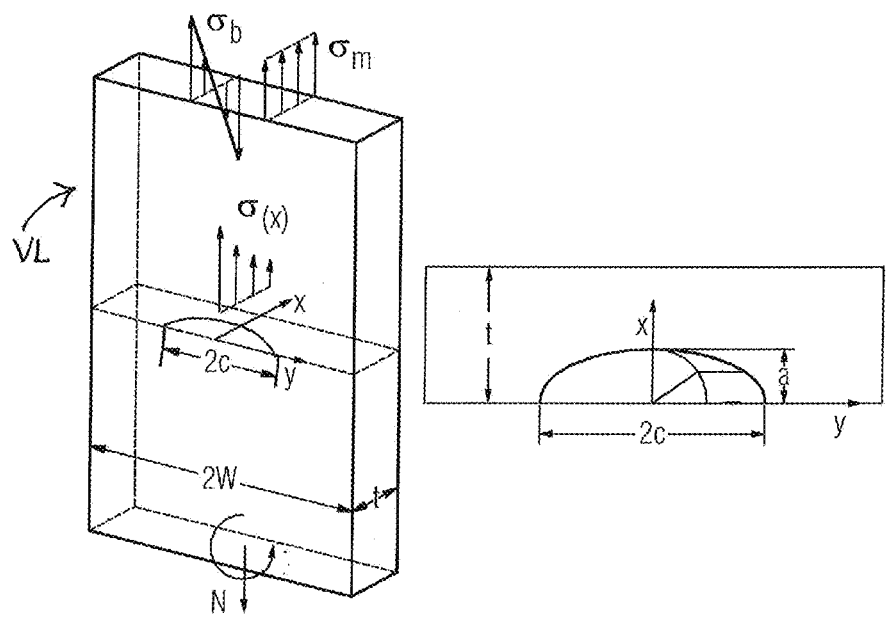
FIG. 1 is a schematic illustration of the geometry of a semi-elliptical surface crack model.

In the illustrated embodiments, the criterion for determining failure is crack instability. Cracks nucleate from inherent flaws, such as preexisting flaws in a forging, or initiate by other crack initiation mechanisms such as Low Cycle Fatigue (LCF). During cyclic loading, for example during a start and shutdown of an engine or another change of operating condition, the cracks grow incrementally until a critical crack size is reached when the crack growth becomes unstable and affects the structural integrity of the component, resulting in failure of the component. Such a failure may be determined by calculating the crack growth, for example by a semi-elliptical surface crack model as illustrated in FIG. 1. The critical crack size may be empirically or experimentally determined.

Figure 2:
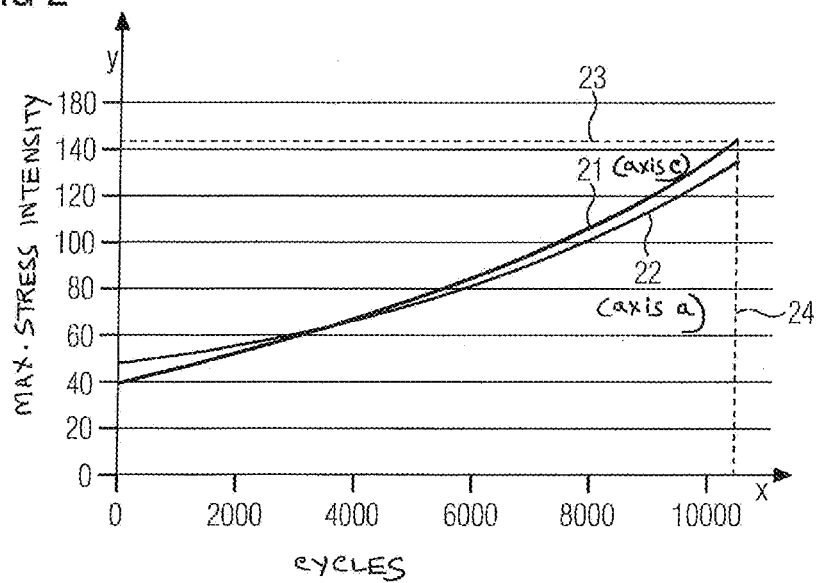
FIG. 2 is an example graph illustrating maximal stress intensity evolution during a cyclic fatigue crack calculation for a surface crack model as shown in FIG. 1.

Referring to FIG. 1, in a component volume VL having a thickness t along an x-axis and a width 2W along a y-axis, the semi-elliptical surface crack is represented by the two half axes a and c. The stress distribution along the x-axis is represented as σ(x) with the stress amplitude being designated as $\sigma_b$ and the mean stress being designated as $\sigma_m$. The maximal stress intensity evolution during a cyclic fatigue crack calculation for such a surface crack model is shown in FIG. 2. In FIG. 2, the Y-axis represents maximum stress intensity K, while the X-axis represents number cycles. The curves 21 and 22 respectively represent the maximal stress intensity evolution along the axes c and a. The fracture toughness value $K_{1c}$ is represented by the dotted line 23. As seen, the crack becomes unstable when the maximal stress intensity along any of the axes a or c exceeds the fracture toughness value. The number of cycles at which this occurs is the fatigue crack life. This is shown by the dotted line 24.

Figure 3:
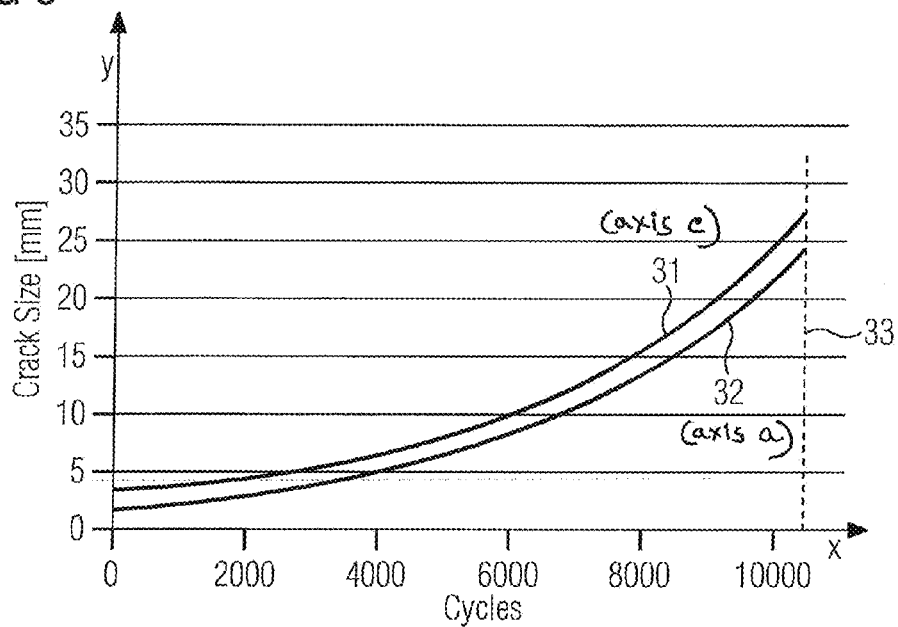
FIG. 3 is an example graph illustrating crack size evolution during a cyclic fatigue crack calculation for a surface crack model as shown in FIG. 1.

FIG. 3 shows the crack size evolution during a cyclic fatigue crack calculation for the above-described surface crack model. Herein, the Y-axis represents crack size, while the X-axis represents number cycles. The curves 31 and 32 respectively represent the crack size evolution along the axes c and a. The fatigue crack life is illustrated by the dashed vertical line 33.

Although a surface crack model is illustrated herein, fatigue crack growth calculations of embedded or corner cracks are similar using different stress intensity factor solutions.

As noted above, determination the fracture mechanics life by LEFM depends on knowledge of certain material properties, which at least includes the fracture toughness $K_{1c}$ and the crack growth rate da/dN. Extensions of LEFM such as FAD or IPZE incorporate further material properties such as yield strength (RP02) and/or ultimate yield strength (RM) and/or Young's modulus (E). Furthermore, initial flaw sizes need to be known in order to perform a LEFM calculation. The term "flaw-size" as used in this discussion refers to an initial flaw-size.

Again, as noted above, the material properties and flaw-sizes have inherent scatter, for example, due to the complexity of the manufacturing process. Exemplary scatter data pertaining to a rotor steel component of a gas turbine are illustrated in FIGS. 4-7, wherein measured actual values are shown, along with mean value material property curves (predicted value) of the component. The actual values can include, for example, data from material tests or additional bootstrapped data based on fitting material data to distributions.

Figure 4:
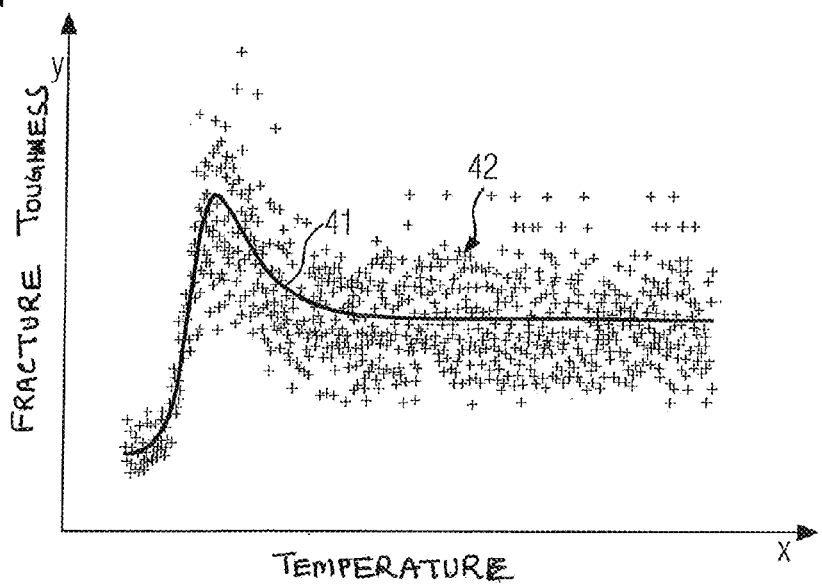
FIG. 4 is an example graph showing a fracture toughness mean value curve and also the plotted actual values.

FIG. 4 shows an example of scatter data (i.e, actual values) of fracture toughness, also showing a fracture toughness mean value curve. Herein the Y-axis represents fracture toughness, while the X-axis represents temperature. The mean value fracture toughness curve is designated as 41, while the actual data is represented 42.

Figure 5:
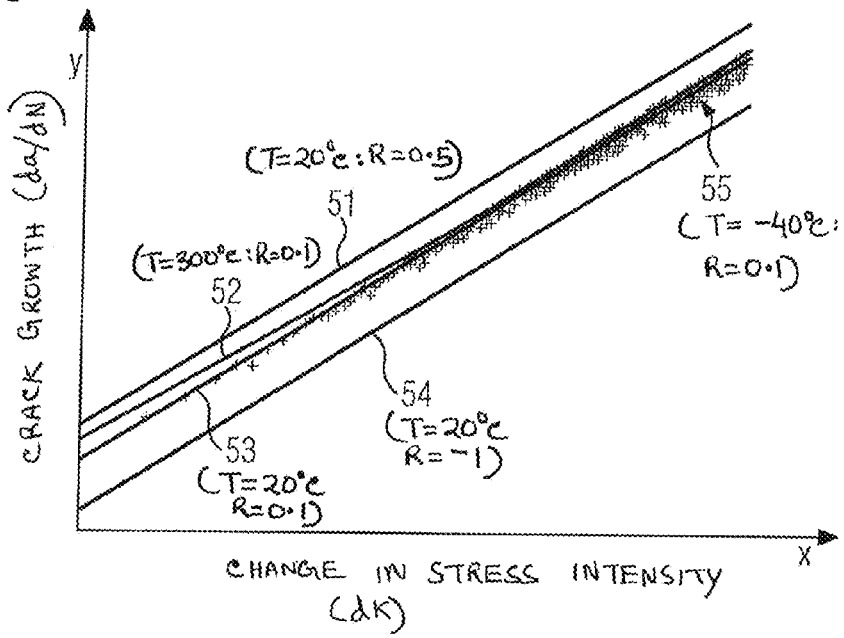
FIG. 5 is an example graph showing a crack growth rate mean value curve and plotted actual values.

FIG. 5 shows an example of scatter data (i.e, actual values) of crack growth, also showing crack growth mean value curves. Herein the Y-axis represents crack growth da/dN, while the X-axis represents change in stress intensity dK. The curve 51 represents the crack growth mean value curve at T=20° C., R=0.5. The curve 52 represents the crack growth mean value curve at T=300° C., R=0.1. The curve 53 represents the crack growth mean value curve at T=20° C., R=0.1. The curve 54 represents the crack growth mean value curve at T=20° C., R=−1. The actual data at T=40° C., R=0.1 is designated as 55. Herein T=temperature and R=R−ratio[stress minimum/stress maximum].

Figure 6:
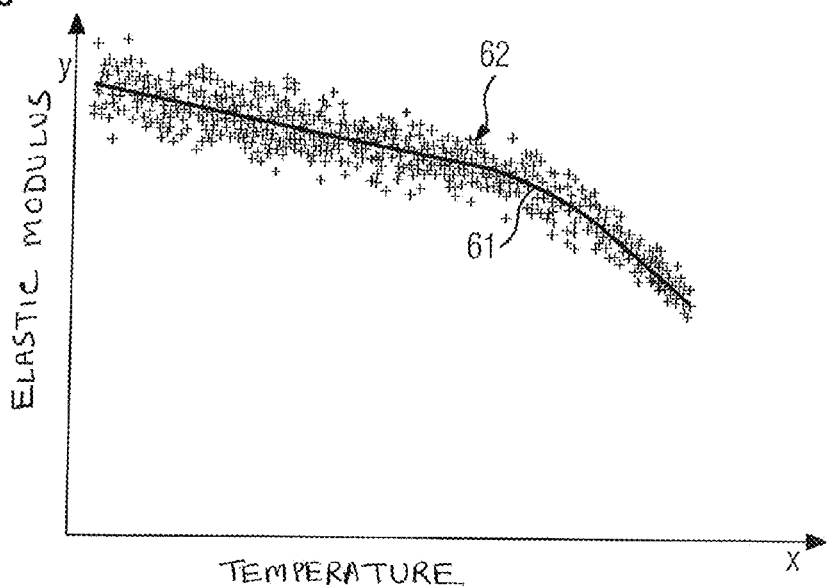
FIG. 6 is an example graph showing a Young's modulus mean value curve and actual values.

FIG. 6 shows an example of scatter data (i.e, actual values) of elastic modulus or Young's modulus, also showing an elastic modulus mean value curve. Herein the Y-axis represents elastic modulus, while the X-axis represents temperature. The mean value elastic modulus curve is designated as 61, while the actual data is represented 62.

Figure 7:
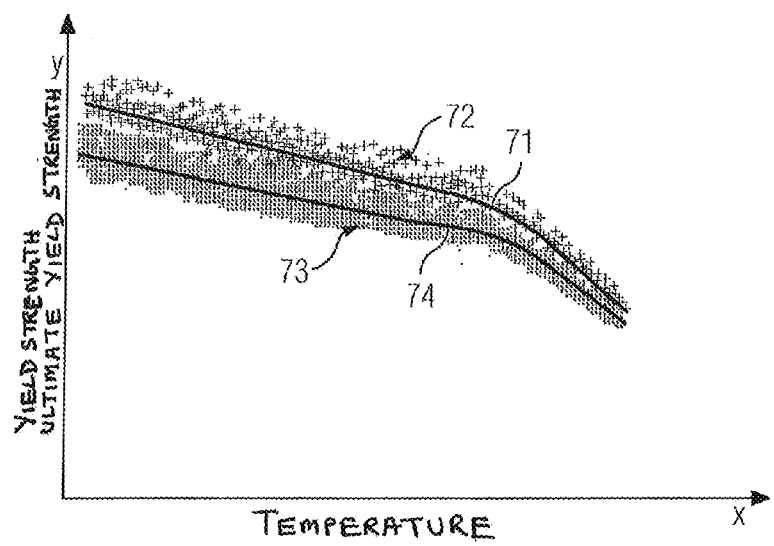
FIG. 7 is an example graph showing Yield and ultimate yield strength mean value curves and actual values.

FIG. 7 shows an example of scatter data (i.e, actual values) of yield strength and ultimate yield strength, also showing a yield strength and ultimate yield strength mean value curves. Herein the Y-axis represents yield strength and ultimate yield strength, while the X-axis represents temperature. The mean value yield strength curve is designated as 71, while the actual data is represented 72. The mean value ultimate yield strength curve is designated as 73, while the actual data is represented 74.

State of the art methods do not take into account scatter of material property data, but instead take into account a mean value of these properties (as seen in FIGS. 4-7) or sometimes even a maximum or minimum value curve of the respective properties, that incorporates a desired factor of safety. Further, none of the state of the art methods incorporate the scatter in flaw-size.

In contrast, embodiments of the present invention incorporate all material property distributions, flaw size distributions and component locations.

Figure 8:
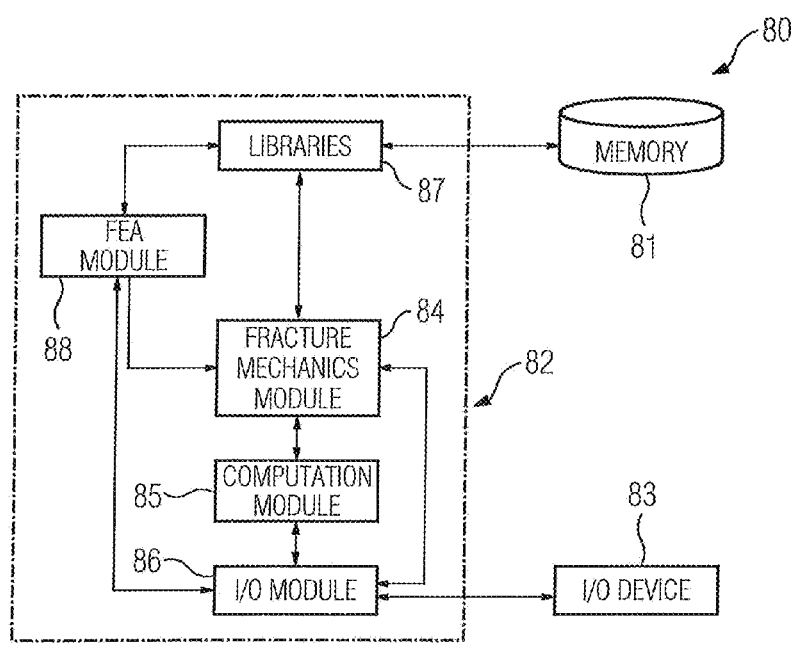
FIG. 8 is a schematic illustration of a system for probabilistic fatigue crack life estimation according one embodiment.

FIG. 8 schematically illustrates a system 80 for fatigue crack life estimation of a component based on direct simulation probabilistic fracture mechanics, according to one embodiment of the present invention. The illustrated system 80 is a computer system comprising a memory 81, processing means 82 and an input-output device 83. The memory 81 stores all material property scatter data (as referred in FIGS. 4-7) and flaw-size scatter data. Additionally, the memory 81 may also store stress-temperature fields. The processing means 82 includes a plurality of functional blocks or modules which may be implemented in hardware and/or software, typically a combination of both. These modules include a fracture mechanics module 84, an FEA module 88, a computation module 85, an I/O module 86, and a plurality of libraries 87, including libraries that handle the memory management of the stress/temperature field, libraries that handle material properties, libraries to handle NDE (such as ultrasound) and flaw information, and high performance look-up table libraries. The libraries may be linked together into an executable. The operation of these functional blocks is described referring to the flowchart shown in FIG. 9.

Figure 9:
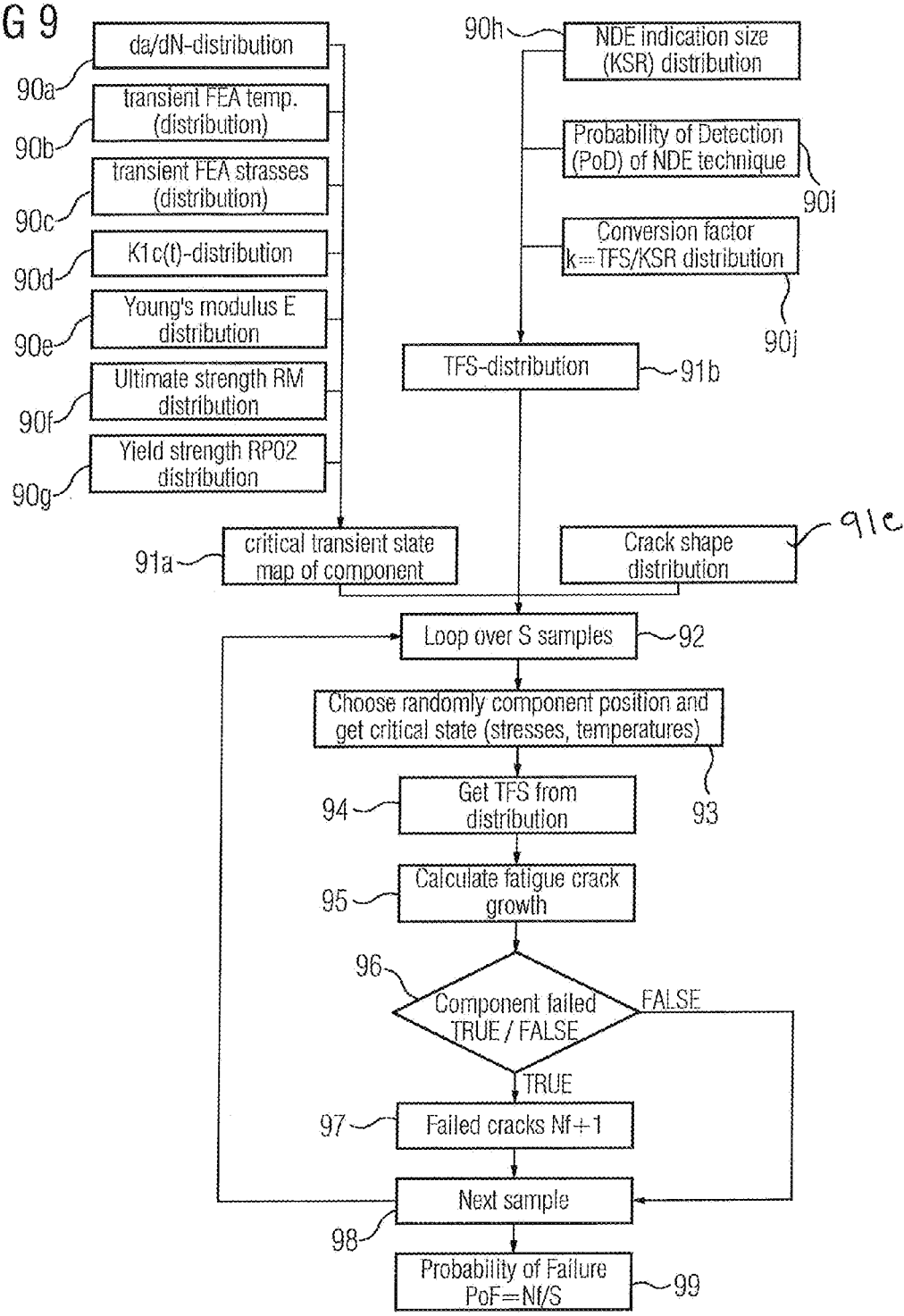
FIG. 9 is a flowchart illustrating a method for probabilistic fatigue crack life estimation according one embodiment.

FIG. 9 illustrates a method 90 for crack life estimation based on direct simulation probabilistic fracture mechanics, according to one embodiment of the present invention. The method 90 utilizes scatter data of material properties and flaw sizes as well stress and temperature fields. This may include, for example material crack growth da/dN (dK) distribution 90a, transient FEA temperature distribution 90b, transient FEA stresses distribution 90c, and fracture toughness $K_{1c}(T)$ distribution 90d. Additional scatter data may include Young's modulus E(T) distribution 90e, Ultimate yield strength RM(T) distribution 90f and yield strength RP02(T) distribution 90g.

The method also uses scatter data pertaining to flaw size including NDE indicated size (KSR) distribution 90h, probability of distribution (PoD) of NDE technique 90i and conversion factor (k=TFS/KSR) distribution 90j.

Referring back to FIG. 8, the above-noted scatter data may be stored in the memory 81 and handled by the respective libraries 87. From the material property and flaw-size scatter data, a large number of representations of the component may be described (typically of the order of millions to trillions). Each representation is defined by one possible material condition and flaw-size condition associated with the component, each condition being configured by drawing values from said distribution (scatter) data.

Referring back to FIG. 9, at block 91a, a critical transient state map of the component is generated based on the material condition of the component. The critical transient state map represents a stress and temperature distribution of the component where each component location is assigned a critical stress value and a critical temperature value. This may be carried out, for example by the FEA module of FIG. 1.

In case a transient problem, such as a start-shutdown cycle of an engine, is assessed, critical stress- and temperature states for each location r within the component during the cycle need to be identified. In general, these critical states are at different times t for different locations r.

The critical time $t_{K1c\text{-}crit}(r)$ for each location r (and thus critical stress $\sigma_{K1c\text{-}crit}(r)$ and temperature $T_{K1c\text{-}crit}(r)$) for unstable crack growth described by the component's fracture toughness K1c(r, T) can be expressed as:

$$t_{K1ckrit}(r) = t\left(\max\left(\frac{\sigma(r,t)}{K_{1c}(r, T(r,t))}\right)\right) \quad \text{eq (1)}$$

The local critical state used to evaluate crack growth rate is defined by the maximum temperature $T_{max}(r)$ and maximum stress amplitude $\Delta\sigma(r)=\sigma_{max}(r)-\sigma_{min}(r)$ during the transient cycle:

$\sigma_{max}(r)=\max(\sigma(r,t))$ $\sigma_{min}(r)=\min(\sigma(r,t))$ $T_{max}(r)=\max(T(r,t))$ \quad eq (2)

Referring back to FIG. 9, at block 91b, the True flaw size distribution is calculated based on the NDE flaw-size data distribution 90h, probability of detection 90i, and conversion factor distribution 90j.

Figure 10:
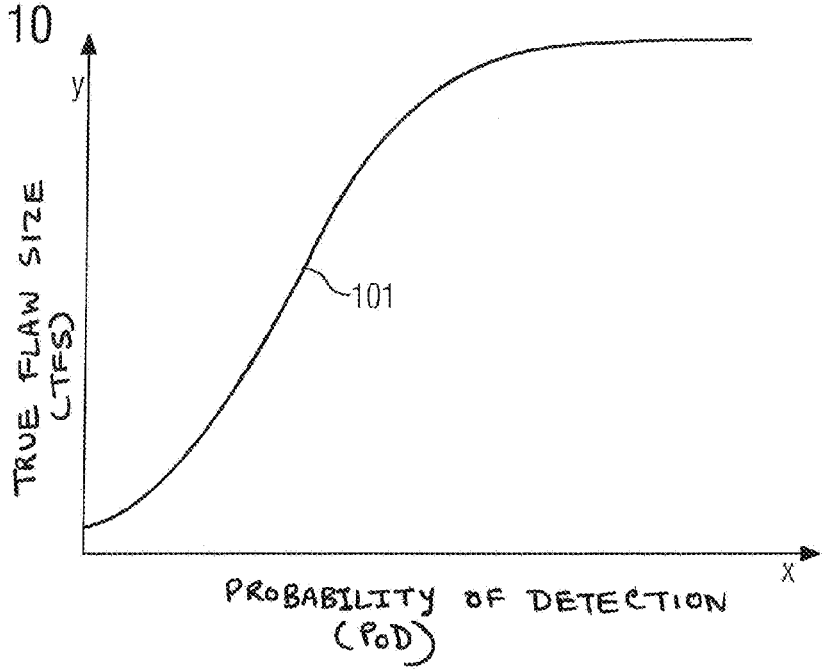
FIG. 10 is an example graph illustrating probability of detection 'PoD' as a function of true Flaw Size 'TFS' for current ultrasonic inspection techniques.
Figure 11:
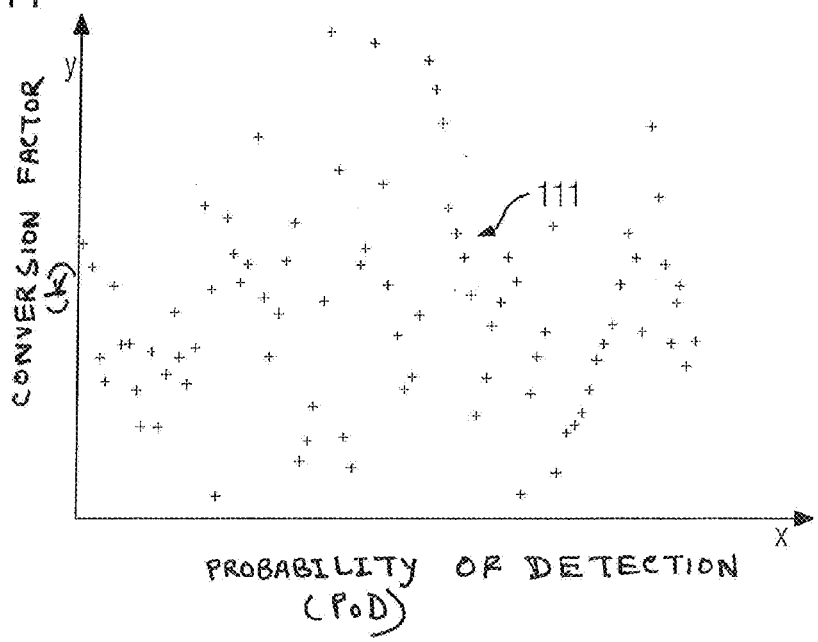
FIG. 11 is an example representation of scatter of conversion factor k.

Regarding probability of detection PoD 90i, it is known that NDE techniques are described by a probability of detection (PoD) curve, which gives information about the probability of detecting a flaw of a certain size (the True Flaw Size or TFS) during such an inspection. FIG. 10 shows an example of such a PoD curve 101 for an Ultrasonic Testing performed during qualification a large rotor forgings (disks and shafts) showing the relationship between the true Flaw size TFS (represented along the X-axis) and the probability of detection PoD (represented along the Y axis). FIG. 11 shows an exemplary scatter of the conversion factor k values 111.

Referring back to FIG. 9 (block 91b), if a functional description of the distributions of the observed KSR-Values ($f_{KSR}(t)$, t:KSR value) and the conversion factor k ($f_k$), as well as the Probability of Detection (PoD) for the NDE technique are available, the TFS distribution ($f_{TFS}(z)$, z: TFS value) may be calculated as follows:

$$f_{TFS_{noPoD}}(z) = \int_{-\infty}^{\infty} \frac{1}{|t|} f_{KSR}(t) \cdot f_k\left(\frac{z}{t}\right) dt \quad \text{eq (3)}$$

$$f_{TFS}(z) = \frac{f_{TFS_{noPoD}}(z)}{PoD(z)}$$

In practice, the distributions are often given by data sets (i.e. measured values), which can be expressed by discrete distributions. In the illustrated embodiment, the TFS distribution data {TFS} is calculated by using the Kronecker multiplication between the KSR data {KSR} and the conversion factor k data {k}, as well as a Monte-Carlo operation $PoD_{MC}$ [{data set}] that exchanges zero-data (or small value data) in {data set} with non-zero data (that accounts for non-detected flaws as described by the PoD) with:

$\{TFS\}=PoD_{MC}[\{KSR\}\otimes\{k\}]$ \quad eq (4)

Figure 12:
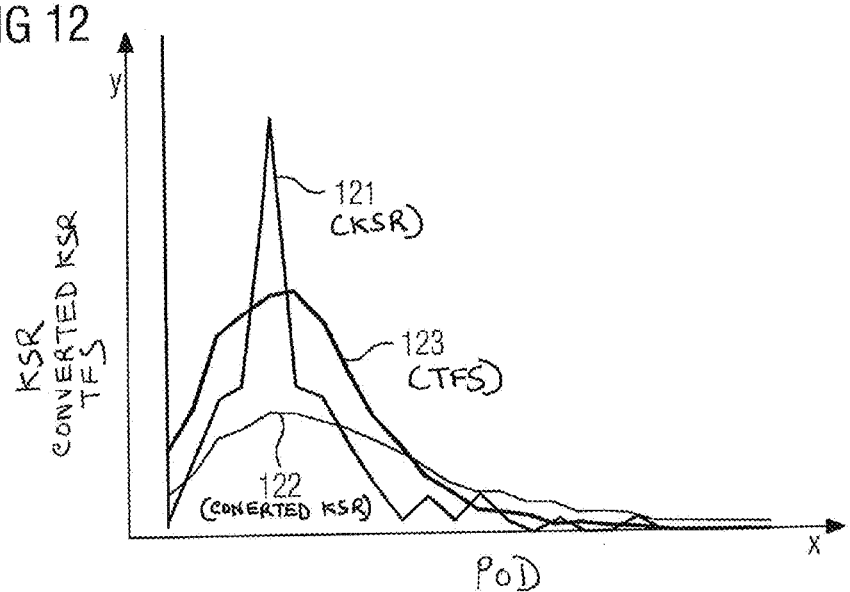
FIG. 12 is an example graph showing the distributions of KSR-, converted KSR- and True Flaw Size.

In the case of large forgings ultrasonic testing (UT) may be the volume NDE technique of choice, besides various surface defect related NDE techniques. FIG. 12 shows flaw-size distribution data for a gas turbine rotor component, wherein the curve 121 represents KSR distribution, the curve 122 represents converted KSR distribution and curve 123 represents TFS distribution. The TFS distribution was calculated utilizing eq(4).

For qualification of a component, oftentimes a maximum indication size is defined. If an NDE indication is larger than this maximum indication size the component will in general not be accepted for use. Such acceptance criteria may also be implemented in the method illustrated above to eliminate, to some extent (depending on PoD, see FIG. 11) large flaws.

Referring back to FIG. 9, the method 90 may include an additional step of determining the crack shape distribution. The data from critical transient state map 91a, TFS distribution 91b and crack shape distribution 91c are then utilized by the fracture mechanics module to determine the fatigue crack life of the component by calculating the crack growth for every sample or representation and determining whether the crack growth of that representation becomes unstable for any given number of cycles N.

The initial crack model might be an embedded elliptical crack described by two parameters a and c. Initially, a distribution of a/c can be used to draw the shape of each initial crack. Furthermore, a model that describes the transition of an embedded crack to a surface crack is implemented. When the crack comes close to the surface of the component during crack growth, the crack can transition to a surface crack. The implementation of such a surface model needs information on position and orientation with respect to the components surface In this manner, a loop is established over S samples (block 92), where S=total number of samples, which may be of the order of millions to trillions in the illustrated example. As mentioned above, each sample or representation represents one possible material condition and flaw-size condition of the component, the condition being defined by drawing values from the respective distribution data.

Figure 17:
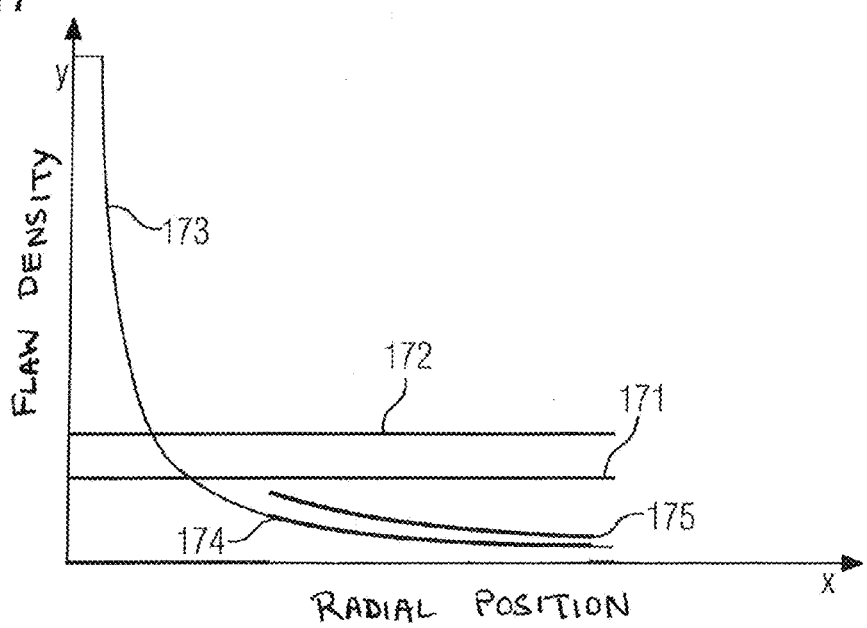
FIG. 17 shows an example of the radial flaw density distribution.

It is assumed that each individual sample or representation has the same probability of occurrence (micro-canonical ensemble) and represents one possible material and flaw-size and position condition of the component in the fleet. In the illustrated example, the flaw position distribution has a radial dependence as shown in FIG. 17, reflecting the larger flaw density towards the center of a forging. FIG. 17 shows an example of the radial flaw density distribution for the investigated component (here, a gas turbine rotor disk). FIG. 17 is a plot of flaw density (Y-axis) versus radial position (X-axis). The curves 171, 172 and 173 respectively show the average database KSR density, average database TFS density and user specified radial KSR density. The curves 174 and 175 show simulated KSR density and simulated TSF density.

Referring back to FIG. 9, block 93, a component location (i.e., a volume element of the component) is randomly selected. The critical states (temperature and stress) of the selected component location can be read from the FEA module into the fracture mechanics module. As mentioned above, the FEA module automatically assigns for each location critical stress/temperature values from a transient (cyclic) FEA that enter the fracture mechanics analysis. Furthermore, each individual representation can have a slightly different stress and temperature distribution accounting for uncertainties in the stress/temperature conditions. Also, slight variations in geometry that account for manufacturing tolerances can also be considered.

In one embodiment, for each location during the operating cycle the stress state can be described by a rank 2 tensor in three dimensions $S_{ij}$. For fracture mechanics purposes there exist multiple approaches on how to deal with the tensorial description of the state of stress in a component. For rotor disks oftentimes the hoop stress is chosen for the description of fracture mechanics. A procedure was implemented that extracts the relevant stress quantity for each location by projecting the stress tensor onto the direction of maximum principal stress during the cycle of interest. This eliminates guess-work on which stress component is relevant. If, for some reason, only certain elements of the stress tensor are available other user-specified stress components can be used as well. The procedure guarantees to extract for each location of the component the most critical stress component and eliminates guess-work and trial on different stress components.

Examples of critical state maps are shown in FIG. 18A-18D. In these examples, the investigated component includes a 2D axis symmetric model of a gas turbine rotor disk.

Figure 18A:
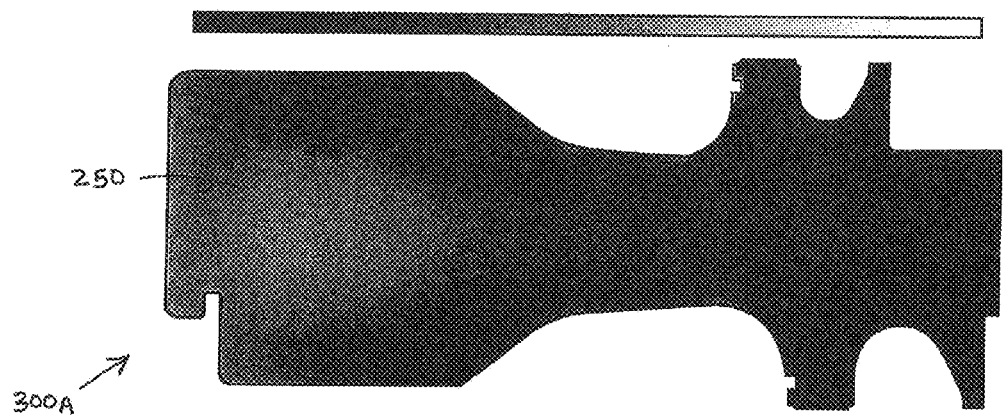
FIG. 18A-D show exemplary critical transient state maps, FIG. 19A-E respectively show the time evolution at one location of the component for the following quantities, namely, angular velocity, temperature, stress, fracture toughness, stress/fracture-toughness.

FIG. 18A shows an example map 300A of the maximum stress amplitude during an operating cycle for the investigated component 250. It is to be noted that, herein, this stress is used to determine the crack growth rate.

Figure 18B:
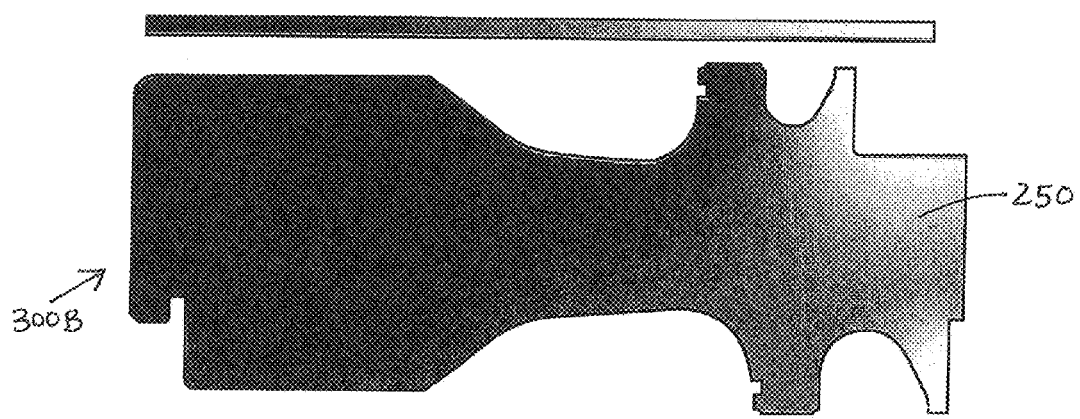

FIG. 18B shows an example map 300B of the maximum temperature during an operating cycle for the investigated component 250. It is to be noted that, herein, this temperature is used to determine the crack growth rate.

Figure 18C:
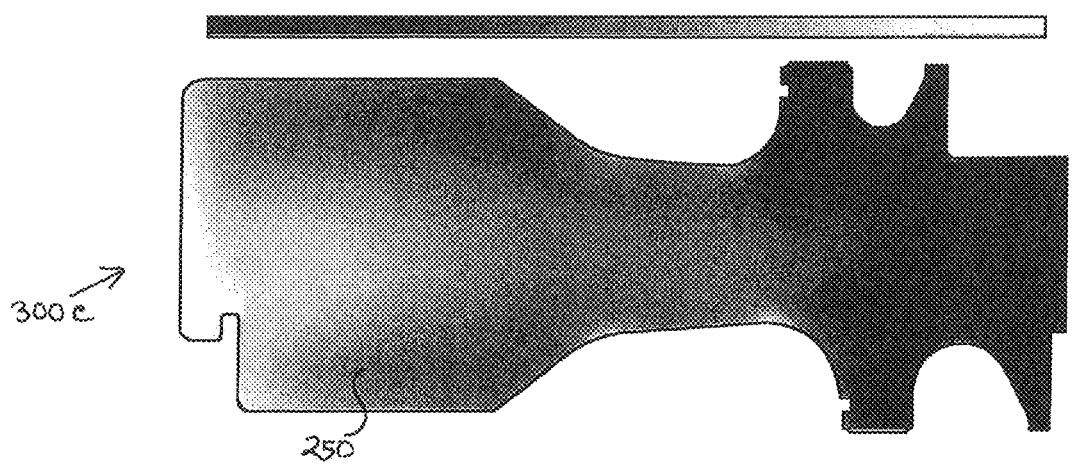

FIG. 18C shows an example map 300C of the maximum ratio of stress and fracture-toughness (s/K1c) during an operating cycle for the investigated component 250. It is to be noted that herein the associated stress and fracture toughness values are used to determine unstable crack growth (component failure).

Figure 18D:
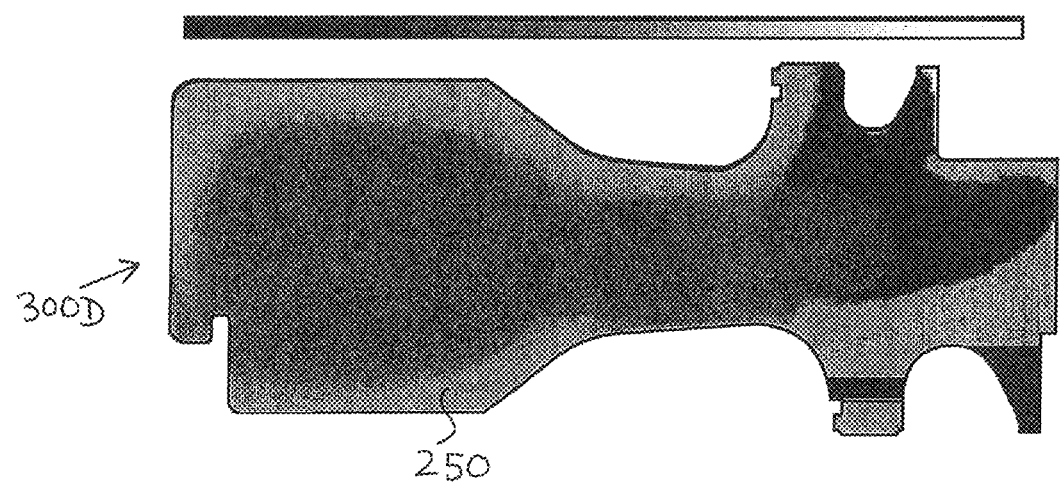
Figure 19A:
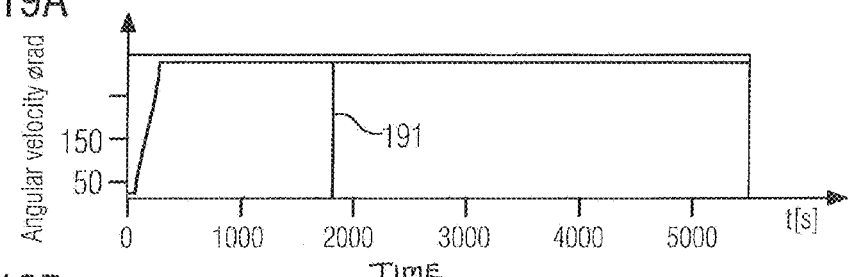
Figure 19B:
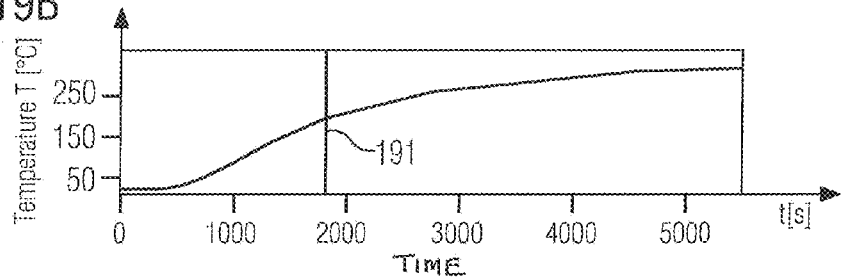
Figure 19C:
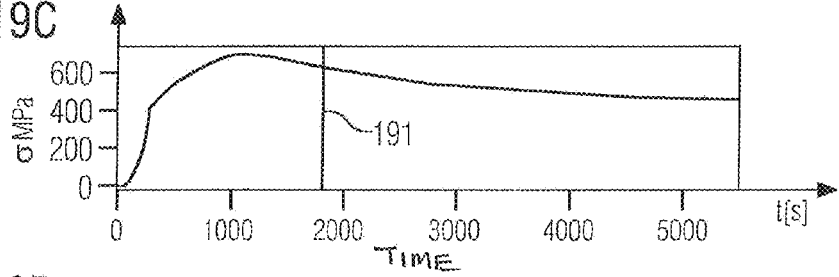
Figure 19D:
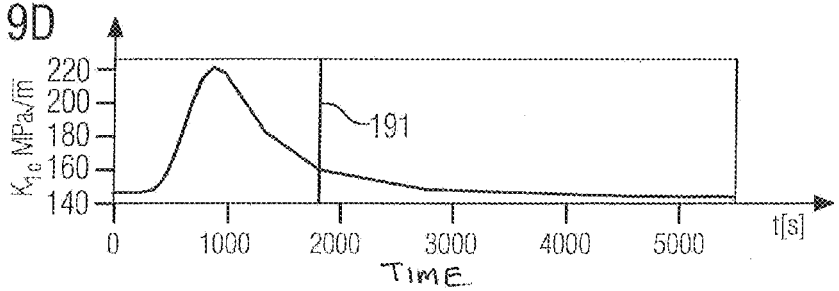
Figure 19E:
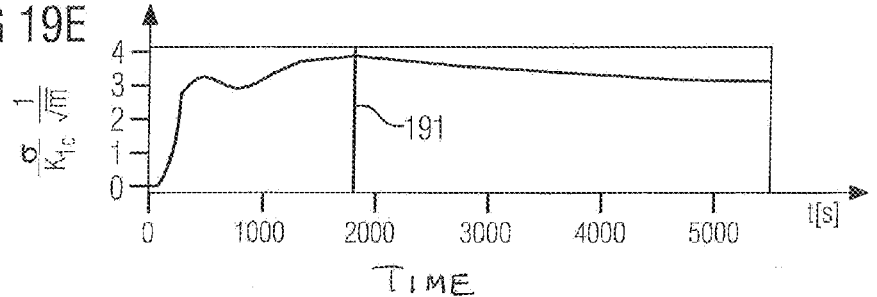

FIG. 18D shows an example map 300D of the load step (point in time) at which the ratio of stress and fracture-toughness (s/K1c) during an operating cycle for the investigated component 250 is maximal.

Although the maps depicted in FIG. 18A-D are in gray-scale, it should be noted at in practice, such maps may also be generated in color, for example, 16 or 32 bits. In one embodiment, such maps may be displayed to the user via the I/O device 83 in FIG. 8.

FIGS. 19A-E respectively show examples of the time evolution at one location of the component for the following quantities, namely, angular velocity, temperature, stress, fracture toughness, stress/fracture-toughness. In each of these FIGS. 19A-E, the vertical line 191 indicates the maximum ratio of stress and fracture toughness that defines the critical point in time for unstable crack growth.

Referring back to FIG. 9, block 94, the initial flaw-size of the selected location is determined from the TFS distribution calculated at block 91b.

At block 95, the crack growth at the selected location of the representation is calculated, for example, by LEFM analyses or any of its extensions such as FAD or IPZE.

Figure 13:
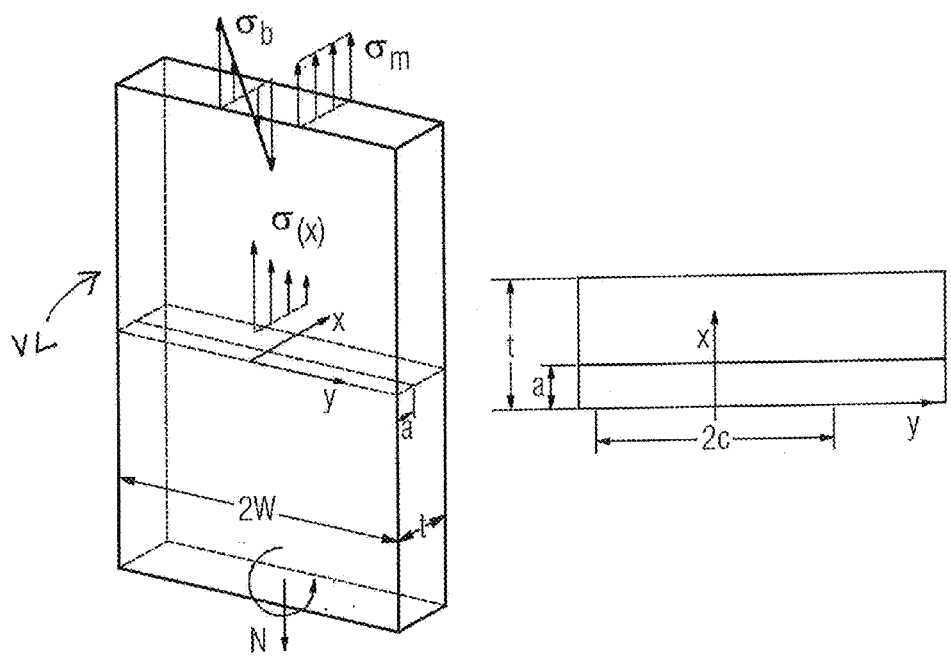
FIG. 13 is a schematic illustration of the geometry of a through wall surface crack model.

The fatigue growth of a semi-elliptical surface crack was illustrated in FIG. 1. The fatigue crack growth of a through wall surface crack, in a component volume VL having a thickness t along an x-axis and a width 2W along a y-axis is illustrated in FIG. 13. In FIG. 13, as in the case of FIG. 1, the stress distribution along the x-axis is represented as σ(x) with the stress amplitude being designated as $\sigma_b$ and the mean stress being designated as $\sigma_m$. In both cases, the crack growth can be calculated by integrating the two half-axis a and c separately:

$$\frac{da}{dN} = f(\Delta K, T, R) \quad \text{eq (5)}$$

$$\Delta K = \Delta\sigma \cdot \sqrt{\pi a} \cdot Y(a, t, W)$$

where
da: Crack size differential,
dN: Cycle differential,
f(ΔK, T, R): Crack growth rate,
ΔK: Cyclic stress intensity amplitude,
T: Temperature,
R: R-ratio, stress minimum/stress maximum,
Δσ: Cyclic stress amplitude,
a, t, W: crack size, plate thickness and width,
Y(a, t, W): geometry factor describing crack geometry.

In the following discussion the T and R dependence is no longer taken into account as the expressions do not explicitly depend on T and R. An approximate solution (discretized by n=0, 1, 2, . . . s, s=number of integration steps) of the ordinary differential equation (ODE) [7] can be achieved by introducing a discrete step size ΔN that yields a finite increment for the crack size a:

$$a_{n+1} = a_n + \Delta a$$

$$\Delta a = \Delta N \cdot f(\Delta K_n) \quad \text{eq (6)}$$

The accuracy of this first order Euler integration scheme depends on the size of ΔN. Higher order integration algorithms such as Runge-Kutta (RK) schemes can be used to increase the accuracy of the solution using the same integration step size ΔN.

According to the proposed embodiment, a modified Runge-Kutta (MRK) algorithm is employed to calculate the crack growth. In a probabilistic fracture mechanics evaluation a large number of fatigue crack growth calculations have to be performed (millions to trillions for a component that has a low PoF). Most of the evaluated cracks will not fail (i.e, the critical crack size will not be reached) within the given number of cycles. In view of this understanding, a modified Runge-Kutta (MRK) integration scheme has been developed that always overestimates the crack growth:

$$a_{n+1} = a_n + \frac{\Delta a_1}{6} + \frac{\Delta a_2}{3} + \frac{\Delta a_3}{3} + \frac{\Delta a_4}{6} \quad \text{eq (7)}$$

$$\Delta a_1 = \Delta N \cdot f(\Delta K_n)$$

$$\Delta a_2 = \Delta N \cdot f\left(\Delta K_n + \frac{1}{2}\frac{\Delta K_n}{2a_n}\Delta a_1\right)$$

$$\Delta a_3 = \Delta N \cdot f\left(\Delta K_n + \frac{1}{2}\frac{\Delta K_n}{2a_n}\Delta a_2\right)$$

$$\Delta a_4 = \Delta N \cdot f\left(\Delta K_n + \frac{\Delta K_n}{2a_n}\Delta a_3\right)$$

Figure 14:
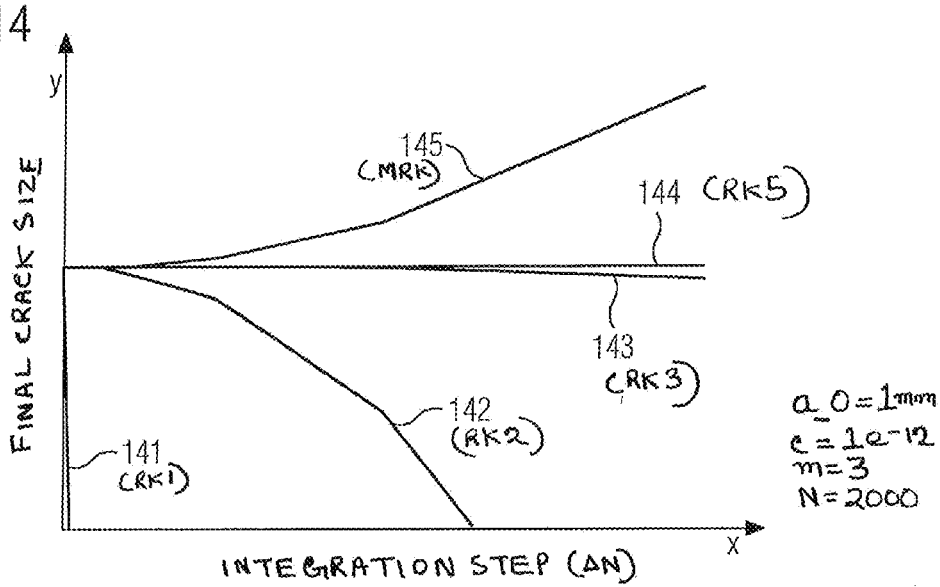
FIG. 14 is an example graph showing a numerical determination of crack size dependent on integration step size.

In FIG. 14, the crack growth calculation as per the proposed MRK scheme is illustrated and compared to the Euler scheme (eq. (6)) and Runge-Kutta algorithms of order 2, 3 and 5 for a center cracked plate a_0=1 mm, c=1e-12, m=3, and N=20000 cycles. In FIG. 14, the Y-axis represents final crack size, while the X-axis represents integration step ΔN (cycles). The curves 141, 142, 143 and 144 respectively represent RK1 (Euler), RK2, RK3 (Heun) and RK5 integration schemes, while the curve 145 represents the MRK scheme of the proposed embodiment. As seen, the proposed MRK scheme always overestimates the crack size irrespective of the integration step size shown.

The proposed MRK scheme allows for a conservative estimation of the crack growth in one (or a few if desired) integration steps. If, after this conservative estimation of the crack growth for the total number of cycles, the crack is still stable, we do not have to further evaluate the crack growth as the component will not fail due to this instance. The calculation time of these stable cracks can be significantly reduced (typically a factor of 1000).

Referring back to FIG. 9, based on the crack growth calculation, it is determined whether the particular sample or representation fails at a given number of cycles N. In one embodiment, a failure is determined when crack size exceeds a predetermined critical crack size. If no failure occurs, the control moves to the next sample via block 98. If a failure is determined at block 96, the counter of the number of failed representations is incremented (block 97). In this way a sum total of the number of samples that failed after N cycles is determined.

The loop ends when the crack growth and failure has been determined for all possible material condition, flaw-size condition and locations of the component.

At block 99, the computation module calculates the probability of failure of the component after N cycles as PoF(N)=Nf/S, wherein PoF(N) is the probability of failure of the component after N cycles, Nf is the sum total of the number of representations that are determined to have failed after N cycles, and S is the total number of representations.

Figure 15:
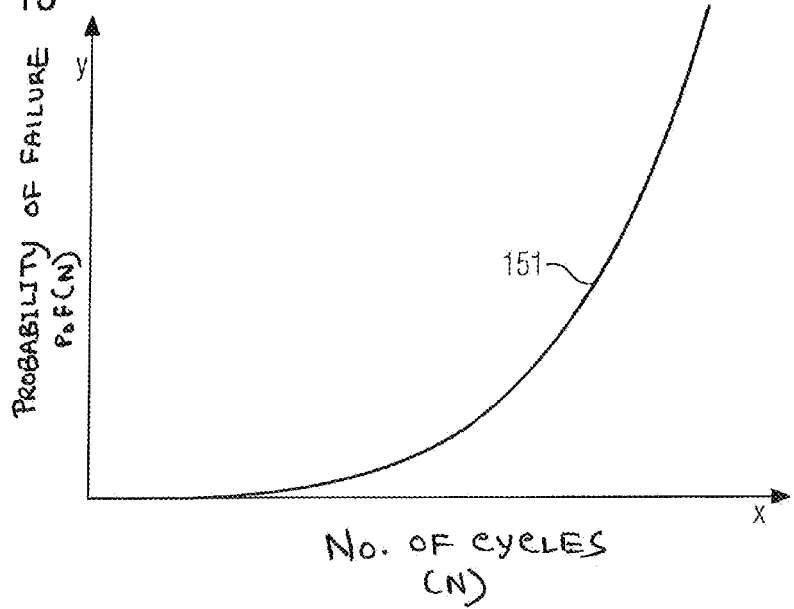
FIG. 15 is an example graph illustrating a probability of failure function PoF(N)

In one embodiment, the probability function may be displayed to the user in the form of a graph via the I/O device 83 in FIG. 8. FIG. 15 shows an example of such probability of failure curve 151, determined by the present method, which can be used to predict the probability of failure of the component after any given number of cycles N.

Figure 20:
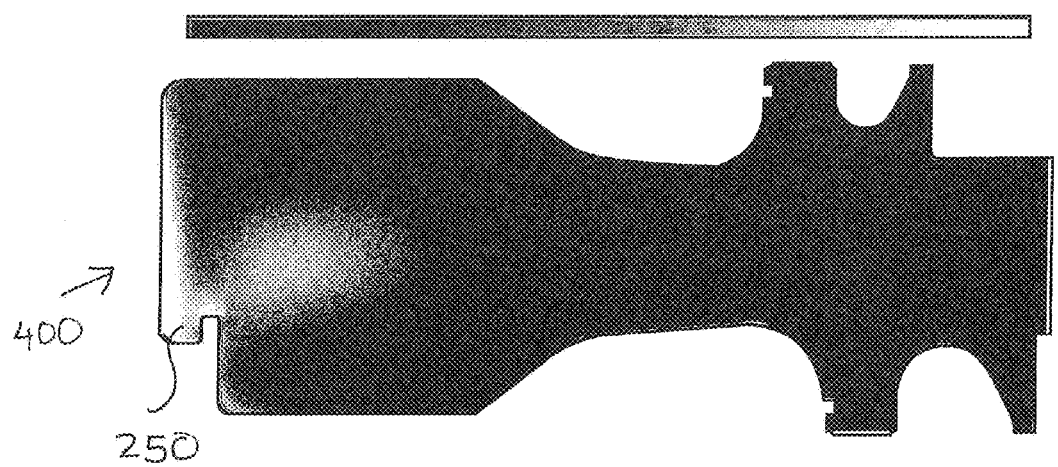
FIG. 20 shows an example of a failure map after a certain number of operating cycles.

In one embodiment, a failure map 400 is generated after a predetermined number of cycles, the failure map indicating the number of failed representations in an area of the component 250. FIG. 20 is example of the failure map after a certain number of operating cycles for the investigated component (here, a 2D axis symmetric model of a gas turbine rotor disk). The failure map shows the number of failed samples in an area (normalized by the number of samples). It is to be noted that FIG. 20 is shown on a logarithmic scale and shows critical regions of the component. In one embodiment, such a failure map may be displayed to the user via the I/O device 83 in FIG. 8. Although the map depicted in FIG. 20 is in grayscale, it should be noted at in practice, such maps may also be generated in color, for example, 16 or 32 bits The above-illustrated technique may be used for operating a component under cyclic stress by scheduling a downtime or maintenance interval of the component taking into account a probabilistic fatigue crack life of the component as estimated above.

Figure 16:
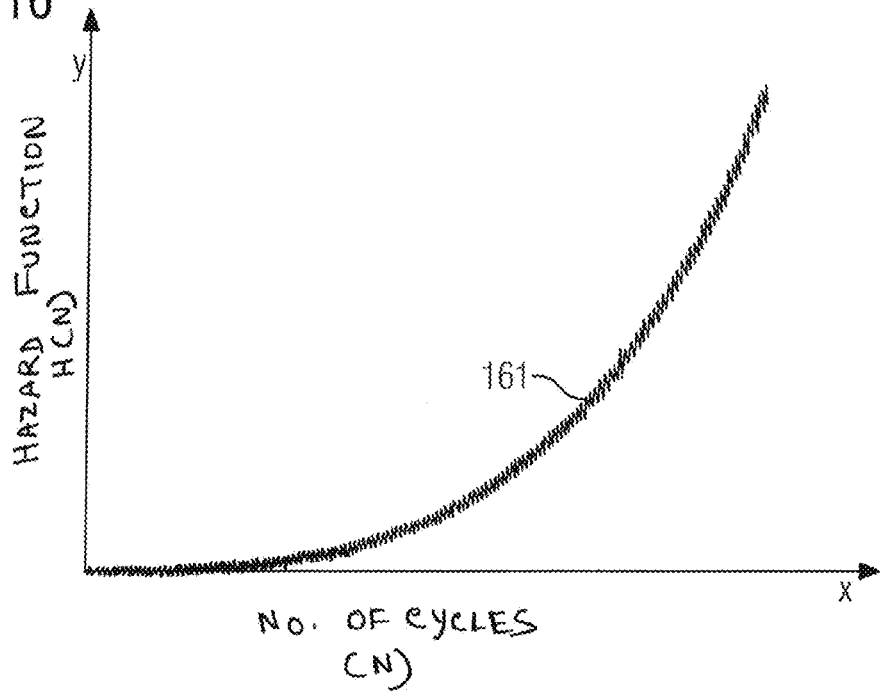
FIG. 16 is an example graph illustrating a hazard function H(N)

In a further embodiment, the computation module may further calculate a hazard function or risk per cycle. The hazard function is approximately he derivative of the probability of failure function PoF(N) and is defined as: H(N+1)=(PoF(N+1)−PoF(N))/(1−PoF(N)), where H is the hazard function or risk per cycle, N is the number of cycles, PoF is the probability of failure. FIG. 16 shows an example of hazard function curve 161, determined by the present method, which can be used to predict the risk per start of the component for any cycle N.

With respect to the computer system of FIG. 8, in one embodiment, the proposed system may also implemented on modern multi-core architectures where each core has its own memory and data set. The so called master-core (or node) distributes the S samples to all nodes such that each of the Q cores (or nodes) calculates only S/Q samples (as individual calculations are independent). After each core performed the calculation the information from each core is gathered on the so called master-node and further analyzed as usual. One possibility is the use of the Message Passing Interface, which is commonly installed on high-performance computer architecture and easily linked to C, C++, and FORTRAN codes. With this approach a further performance gain by a factor of almost Q is achieved. This gain can be significant as modern clusters easily have thousands of cores. For example, an exemplary calculation performed in 7.5 days (=10,800 min) on a single core of an AMD Opteron Quad-Core Processor 2380 can be executed in about 11 minutes when utilizing 1000 cores of the same core architecture.

While specific embodiments have been described in detail, those with ordinary skill in the art will appreciate that various modifications and alternative to those details could be developed in light of the overall teachings of the disclosure. For example, elements described in association with different embodiments may be combined. Accordingly, the particular arrangements disclosed are meant to be illustrative only and should not be construed as limiting the scope of the claims or disclosure, which are to be given the full breadth of the appended claims, and any and all equivalents thereof. It should be noted that the term "comprising" does not exclude other elements or steps and the use of articles "a" or "an" does not exclude a plurality.

The invention claimed is:

1. A method for operating a gas turbine component under cyclic stress, the method comprising:
operating a system for probabilistic fatigue crack life estimation, said system comprising a processor and an output device, the system being operated for:
    defining a plurality of representations of the component from material property scatter data and flaw-size scatter data of the component, wherein each representation is defined by one possible material condition and flaw-size condition associated with the component,
    for each individual representation, selecting a component location and determining whether said individual representation fails after a given number of cycles N, based on determination of a crack growth in the selected location, the crack growth being determined on the basis of the material condition and the flaw-size condition in the selected location, wherein failure of the individual representation is determined if the crack growth is determined to be unstable,
    determining a sum total of the number of the representations that failed after N cycles, and
    determining and outputting a probability of failure of the component after N cycles, as PoF(N)=Nf/S, wherein:
    PoF(N) is the probability of failure of the component after N cycles,
    Nf is the sum total of the number of representations that are determined to have failed after N cycles, and
    S is the total number of representations, and
controlling a downtime of the component based on an output generated by said system.

2. The method according to claim 1, further comprising:
    generating a failure map after a predetermined number of cycles, the failure map indicating the number of failed representations in an area.

3. The method according to claim 1, wherein each material condition is defined by drawing values from scatter data of material properties of the component which include at least fracture toughness $K_{1c}$ and crack growth rate da/dN,
where
    da=crack size increment,
    dN=cycle increment.

4. The method according to claim 1, wherein each individual crack growth determination is carried out via a simulation based on Linear Elastic Fracture Mechanics.

5. The method according to claim 3, wherein the material properties further include yield strength RP02 and/or ultimate yield strength RM and/or Young's modulus E.

6. The method according to claim 3, further comprising:
generating a critical transient state map of the component based on the material condition of the component,
wherein the critical transient state map represents a stress and temperature distribution of the component where each component location is assigned a critical stress value and a critical temperature value.

7. The method according to claim 6, wherein the critical transient state map is generated via a transient Finite Element Analysis.

8. The method according to claim 6, wherein each individual representation is assigned a slightly different stress and/or temperature distribution.

9. The method according to claim 1,
wherein the crack growth is determined by a numerical integration of a crack growth rate da/dN, where da designates crack size increment and dN designates cycle increment,
wherein the integration is carried out using a modified Runge-Kutta integration scheme that always over-estimates the crack-growth irrespective of the integration step size.

10. The method according to claim 1, wherein the flaw-size condition of a selected location of an individual representation is obtained from a True Flaw Size distribution data, wherein the True Flaw Size distribution data is determined based on:
non-destructive-examination indicated flaw size distribution data,
a probability of detection PoD of said non-destructive-examination technique, and
conversion factor distribution data, wherein conversion factor is defined as k=TFS/KSR, where:
K designates conversion factor,
TFS designates a True Flaw Size, and
KSR designates a non-destructive-examination indicated flaw size.

11. The method according to claim 10, wherein the True Flaw Size distribution data is determined as:

$$\{TFS\} = PoD_{MC}[\{KSR\} \otimes \{k\}]$$

where:
{TFS} designates True Flaw Size distribution data,
{KSR} designates non-destructive-examination indicated flaw-size distribution data,
{k} designates conversion factor distribution data,
⊗ designates a Kronecker multiplication operation, and
$PoD_{MC}$ is a Monte-Carlo operation on a data set that exchanges zero-data or small value data in the data set with non-zero data that accounts for non-detected flaws as described by the probability of detection of the non-destructive-examination technique.

12. The method according to claim 1, further comprising:
determining a hazard function or risk per cycle, as $$H(N+1) = (PoF(N+1) - PoF(N))/(1 - PoF(N))$$

where:
H is the hazard function or risk per cycle,
N is the number of cycles,
PoF is the probability of failure.

13. A gas turbine system comprising:
a system for probabilistic estimation of fatigue crack life of a gas turbine component configured for being subjected cyclic stress, comprising:
a memory for storing material property scatter data and flaw-size scatter data, an input/output device, and processing means including processing modules implemented in a processor, comprising:
a library module comprising a plurality of libraries for handling memory management, wherein using said libraries, a plurality of representations of the component are defined, wherein each representation is defined by one possible material condition and flaw-size condition associated with the component,
a fracture mechanics module for determining whether an individual representation fails after a given number of cycles N, based on determination of a crack growth in a selected location in said representation, the crack growth being determined on the basis of the material condition and the flaw-size condition in the selected location, wherein failure of the individual representation is determined if the crack growth is determined to be unstable, wherein the fracture mechanics module is configured to carry out said failure determination for each of the plurality of representations,
a computation module for determining a probability of failure of the component after N cycles, as PoF(N)= Nf/S, where:
PoF(N) is the probability of failure of the component after N cycles,
Nf is a sum total of the number of representations that are determined to have failed after N cycles by the fracture mechanics module, and S is the total number of representations, and
an output module for outputting the probability of failure of the component, wherein the gas turbine system controls a downtime of the gas turbine component based on said output.

14. The system according to claim 13, further comprising:
a finite element analysis module for generating a critical transient state map of the component based on the material condition of the component,
wherein the critical transient state map represents a stress and temperature distribution of the component where each component location is assigned a critical stress value and a critical temperature value.

* * * * *